United States Patent [19]

Kanno

[11] Patent Number: 5,136,279
[45] Date of Patent: Aug. 4, 1992

[54] BATTERY DISCONNECTION AND ABNORMAL OUTPUT WARNING DEVICE FOR TRIGGERING ENGINE SPEED REDUCTION

[75] Inventor: Isao Kanno, Hamamatsu, Japan

[73] Assignee: Sanshin Kogyo Kabushiki Kaisha, Hamamatsu, Japan

[21] Appl. No.: 728,790

[22] Filed: Jul. 5, 1991

Related U.S. Application Data

[63] Continuation of Ser. No. 501,361, Mar. 18, 1990, abandoned, which is a continuation of Ser. No. 167,306, Mar. 11, 1988, abandoned.

[30] Foreign Application Priority Data

Mar. 14, 1987 [JP] Japan .................................. 62-59704

[51] Int. Cl.⁵ ............................................. G08B 21/00
[52] U.S. Cl. .................................... 340/636; 440/1; 440/2; 340/455; 340/438
[58] Field of Search ............... 340/636, 455, 438, 428, 340/439; 440/1, 2; 307/10.3, 10.1, 10.6; 123/198 D, 198 DC, 350

[56] References Cited

U.S. PATENT DOCUMENTS

| | | | |
|---|---|---|---|
| 3,815,088 | 6/1974 | Kumpfbeck et al. | 340/428 |
| 3,942,097 | 3/1976 | Itoh et al. | 320/64 |
| 4,012,681 | 3/1977 | Finger et al. | 340/636 |
| 4,246,493 | 1/1981 | Beeghly | 123/198 DC |
| 4,348,628 | 9/1982 | Loucks | 320/6 |
| 4,435,649 | 3/1984 | Vandigriff | 307/10.3 |
| 4,563,628 | 1/1986 | Tietz et al. | 340/636 |
| 4,604,565 | 8/1986 | Yokota et al. | 320/15 |
| 4,619,231 | 10/1986 | Stolar et al. | 123/198 DC |
| 4,644,334 | 2/1987 | Yato et al. | 340/461 |
| 4,651,081 | 3/1987 | Nishimura et al. | 320/30 |
| 4,761,631 | 8/1988 | Hwang | 340/636 |
| 4,803,459 | 2/1989 | Ta | 340/459 |
| 4,943,777 | 7/1990 | Nakamura et al. | 320/48 |

*Primary Examiner*—Edward L. Coles, Sr.
*Assistant Examiner*—Jill Jackson
*Attorney, Agent, or Firm*—Ernest A. Buetler

[57] ABSTRACT

An ignition device for a marine propulsion unit that provides a warning signal in the event of an abnormal engine running condition. The warning system is powered by a pair of alternately charged batteries and the warning signal is also activated in the event the batteries are disconnected or are malfunctioning. The engine is also provided with a protection system for reducing its speed in the event of an abnormal running condition and the system incorporates a holding circuit for continuing to maintain the engine at its reduced speed in the event of temporary interruption of battery power and subsequent reconnection of that battery power.

4 Claims, 1 Drawing Sheet

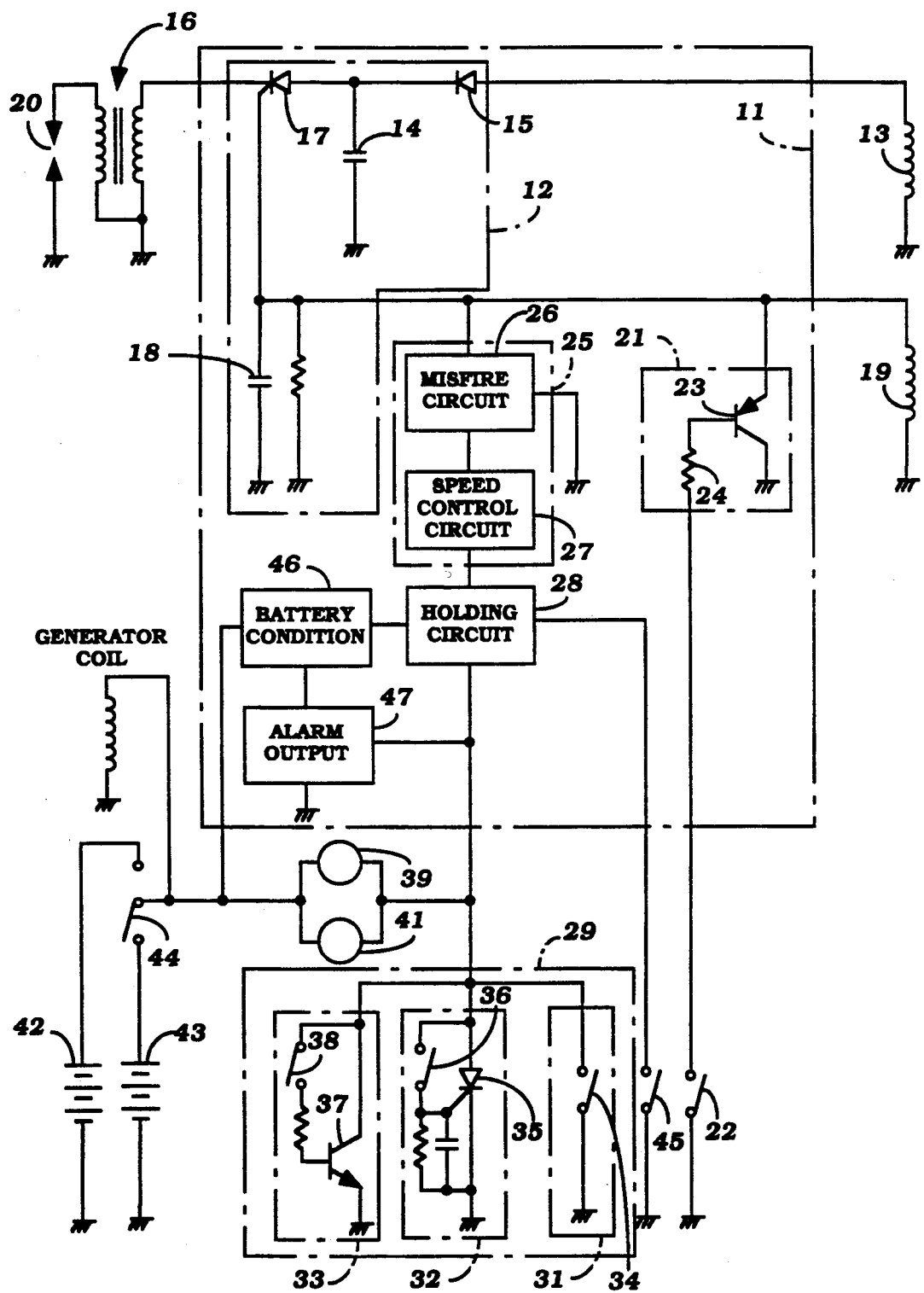

BATTERY DISCONNECTION AND ABNORMAL OUTPUT WARNING DEVICE FOR TRIGGERING ENGINE SPEED REDUCTION

This is a continuation of U.S. patent application Ser. No. 501,361, filed Mar. 18, 1990 now abandoned which application is a continuation of application Ser. No. 167,306, filed Mar. 11, 1988, now abandoned.

BACKGROUND OF THE INVENTION

This invention relates to an ignition device for a marine propulsion unit and more particularly to an improved arrangement for providing a warning signal in the event of variations in the output of the powering batteries for a vehicle system.

It is well known in connection with various propulsion units such as marine propulsion units to provide a warning system that gives the operator a warning in the event of an abnormal running condition of the engine. For example, such warnings may be given in the event the engine overheats, the oil level is low or various other abnormalities which may arise in the engine operation. In accordance with these systems, it is the normal practice to employ a pair of batteries one of which is charged by the engine and operates the engine ignition system and the other of which powers the warning system. These arrangements include a switching device so that the battery which is being charged is alternated so as to maintain a charge on both batteries. However, the switching operation and/or difference in battery charge states may give rise to incorrect warning signals due to electrical noise.

It is, therefore, a principal object of this invention to provide an improved arrangement for providing a warning to the operator in the even of an abnormal battery condition.

It is a further object of this invention to provide an improved warning system for a vehicle.

In connection with warning systems of the type described, it is also the practice to provide an arrangement which will effect slowing of the speed of the engine in the event of certain malfunctions. For example, there are provided devices which will slow the speed of the engine by periodically misfiring its ignition in the event of low oil level. These systems normally use an SCR that is switched on when the oil level falls. However, if there is a battery system of the type aforedescribed, the switching of the system from one battery to the other will cause the SCR to be turned off and when the newly charged battery is connected to the circuit, the engine may speed up unexpectedly and cause obvious problems.

It is, therefore, a further object of the is invention to provide a warning system for a marine propulsion unit wherein inadvertent speeding up of the engine is avoided when there is an abnormal running condition and the electrical power is periodically interrupted and reconnected.

SUMMARY OF THE INVENTION

This invention is adapted to be embodied in an engine system having a battery which is charged by the engine and a warning system for indicating abnormal running conditions of the engine. The warning system is powered by the battery. In accordance with the invention, a warning signal is given in the event of interruption of battery power or in the event of an abnormal battery output.

Another feature of this invention is adapted to embodied in an engine system having a battery that is charged by the engine and a protection system for slowing the speed of the engine in the event of an abnormal running condition. In accordance with this feature of the invention, a holding circuit is incorporated for maintaining the engine speed at its lower setting in the event of the abnormal condition and if battery power is temporarily disconnected and then reconnected.

BRIEF DESCRIPTION OF THE DRAWINGS

The single FIGURE of the drawing shows an ignition system and warning arrangement for an internal combustion engine constructed in accordance with an embodiment of the invention.

DETAILED DESCRIPTION OF THE PREFERRED EMBODIMENT

In the drawing the reference numeral 11 indicates generally a control circuit for an internal combustion engine that includes an ignition system 12 of the SCR type. The engine may be used for powering a vehicle such as a watercraft. The ignition system 12 is comprised of a charging coil 13 which is associated with a flywheel magneto of the associated internal combustion engine and which charges a firing capacitor 14 through a diode 15. The charging capacitor 14 is in circuit with the primary winding of an ignition coil 16 through a an SCR 17 which has its base connected to the ground through a capacitor 18. A pulser coil 19 is provided for changing the state of the SCR 17 for rendering it conductive when the engine crankshaft is at the appropriate angle so as to discharge the firing capacitor 14 through the primary winding of the ignition coil 16. This induces a voltage in the secondary winding which fires a spark plug 20 in a known manner.

There is also provided a kill circuit 21 for the ignition system for stopping running of the engine. The kill circuit 21 is adapted to ground the output from the pulser coil 19 and prevent the switching on of the SCR 17. For this purpose, there is provided a kill switch 22 that changes the bias of the base of a transistor 23 through a resistor 24 for grounding the pulser coil 19 and preventing ignition. The kill switch 22 is positioned in proximity to the operator of the engine so as to permit stopping of the engine.

There is also provided a system for protecting the engine in the event of certain malfunctions and this protecting system includes an engine protection circuit, indicated generally by the reference numeral 25. The engine protection circuit 25 functions to protect the engine in the event of an abnormal condition.

If the engine is used in conjunction with a vehicle such as a watercraft, it is desirable to ensure that the engine may continue to run so that the operator may reach the shore in the event of an abnormal condition. To this end, the engine protection circuit 25 includes a misfiring circuit 26 that is effective to block certain of the firing pulses from the pulser coil 19 so that the engine will fire only intermittently and thus have its speed limited.

The misfiring circuit 26 is controlled by means of a control circuit 27 which, in turn, is operated by a holding circuit 28. The holding circuit 28 has its state changed by means of an abnormality detecting device, indicated schematically by the block 29. This abnormality detecting device 29 includes, for example, an overheat detecting switch 31, an oil level detecting switch 32 and an alarm detecting switch 33. The overheat detecting switch 31 includes a contact 34 which is closed when the temperature of the engine exceeds a predetermined value so as to activate the holding circuit 28 and cause the engine protection device 25 to be activated.

The oil level detecting circuit 32 includes an SCR 35 which is switched by means of a switch 36 that is operative in response to oil level for effecting a ground and switching the holding circuit 28 on. The alarm circuit 33 includes a transistor 37 that has its base switch to become conductive by a switch 38 so as to activate the holding circuit 28 and the engine protecting circuit 25.

In addition to activating the engine protection circuit 25, there is provided a warning indicator including a buzzer 39 and warning indicator lamp 41 that are activated when the warning detecting unit 39 outputs a signal. The buzzer 39 and warning light 41 are powered by either of two alternative batteries 42 and 43 which are selectively energized by a switch 44. The switch 44 is periodically switched so that either the battery 42 supplies the warning system 29 and the battery 43 is charged or vice versa.

In order to reset the engine protecting circuit 25, there is provided a switch 45 that activates the reset of the holding circuit 28 so as to permit the operator to return the engine to normal engine speed. The switch 45 may be operated in any of a variety of manners such as by having the operator shift the transmission into neutral, return the throttle lever to idle position or a similar arrangement.

In accordance with the invention, there is also incorporated a means for providing a warning indication in the event the batteries 42 and 43 are both disconnected or one of the batteries is at an abnormally low state of charge or otherwise malfunctions. To this end, there is provided a battery detecting circuit 46 that senses the condition of the battery and operates an alarm output circuit 47 to activate the alarms 39 and 41 in the event the batteries are in a bad state of charge or are disconnected.

It should be noted that the misfire circuit 26 is controlled by closing of the low oil level switch 36 to turn the transistor 35 on and protect the engine in the event of low oil level. If, however, the switch 44 is disconnected from one of the batteries 42 or 43 and reconnected to the other of the batteries 42 and 43 under this condition, the opening of the switch 44 will cause the SCR 35 to be turned back off. As a result, when the new battery is connected, the misfiring circuit 26 would have been turned off the prior art devices and the engine could unexpectedly speed up. However, with this invention the holding circuit 28 holds the misfiring circuit in its enabled condition during this temporary disconnection of the batteries so as to ensure that this inadvertent engine speed up will not occur.

As has been previously noted, the engine can be returned to full operating speed by closing the switch 45 by shifting the engine into neutral or, alternatively, by any of a variety of other manners such as reducing the speed of the engine to idle and the reaccelerating it.

It is to be understood that the foregoing description is that of a preferred embodiment of the invention and that various changes and modifications may be made without departing from the spirit and scope of the invention, as defined by the appended claims.

I claim:

1. An engine system having a pair of batteries alternately charged by the engine through a charging circuit and a warning system for indicating an abnormal running condition of said engine, said warning system being in circuit with the battery not being charged, the improvement comprising means for providing a warning signal in the event of interruption of battery power upon each of disconnection of the battery from the warning system to which it is connected and an abnormal battery output.

2. An engine system as set forth in claim wherein the warning signal is further effective to reduce the speed of the engine.

3. An engine system as set forth in claim 2 further including holding means for continuing to reduce the speed of the engine in the event of temporary interruption of battery power.

4. An engine system having a battery and an engine protection system comprising sensing means for sensing an abnormal running condition and means for reducing the speed of the engine in the event an abnormal running condition is sensed by said sensing means comprising a circuit including a transistor which is switched to one of its states to effect a reduction of the speed of the engine when the sensing means senses an abnormal condition, the improvement comprising holding means for holding the engine protection system in its speed reduction mode in the event temporary disconnection of battery power occurs when said engine speed has been reduced to maintain the engine speed reduction, said holding means comprising means for maintaining the switched state of said transistor in the event of disconnection of the battery power.

* * * * *

UNITED STATES PATENT AND TRADEMARK OFFICE
CERTIFICATE OF CORRECTION

PATENT NO. : 5,136,279
DATED : August 4, 1992
INVENTOR(S) : Isao Kanno

It is certified that error appears in the above-identified patent and that said Letters Patent is hereby corrected as shown below:

Column 4, line 28, Claim 2, after "claim" insert --1--.

Signed and Sealed this

Twelfth Day of October, 1993

Attest:

BRUCE LEHMAN

Attesting Officer     Commissioner of Patents and Trademarks